(12) United States Patent
Kajiyama et al.

(10) Patent No.: US 8,330,711 B2
(45) Date of Patent: Dec. 11, 2012

(54) DISPLAY DEVICE

(75) Inventors: Kenta Kajiyama, Mobara (JP); Takeshi Izumida, Mobara (JP); Norihiro Nakamura, Mobara (JP)

(73) Assignees: Hitachi Displays, Ltd., Chiba (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 499 days.

(21) Appl. No.: 12/551,678

(22) Filed: Sep. 1, 2009

(65) Prior Publication Data

US 2010/0053042 A1  Mar. 4, 2010

(30) Foreign Application Priority Data

Sep. 1, 2008 (JP) ................................. 2008-223808

(51) Int. Cl.
*G09G 3/36* (2006.01)
(52) U.S. Cl. .............................. 345/103; 345/55; 345/76
(58) Field of Classification Search ........................ None
See application file for complete search history.

(56) References Cited

U.S. PATENT DOCUMENTS

| 2007/0001956 A1* | 1/2007 | Yeh et al. .......................... 345/92 |
| 2009/0040149 A1* | 2/2009 | Nishinohara .................... 345/76 |
| 2009/0207118 A1* | 8/2009 | Lee et al. ......................... 345/98 |
| 2009/0244041 A1* | 10/2009 | Choe .............................. 345/211 |
| 2010/0171725 A1* | 7/2010 | Tsai et al. ...................... 345/205 |
| 2010/0245332 A1* | 9/2010 | Hsu .............................. 345/213 |

FOREIGN PATENT DOCUMENTS

| JP | 2003-005709 | 1/2003 |
| JP | 2003-122301 | 4/2003 |

* cited by examiner

*Primary Examiner* — Adam R Giesy
(74) *Attorney, Agent, or Firm* — Antonelli, Terry, Stout & Kraus, LLP.

(57) ABSTRACT

A plurality of data signal lines each of which is connected to at least one pixel circuit in one pixel circuit column and is not connected to the pixel circuits of other pixel circuit columns are provided to one pixel circuit column, and the pixel circuits in the pixel circuit column are connected to any one of the plurality of data signal lines. An image display device having such a constitution can alleviate lowering of display quality attributed to transmission delay or voltage drop of a scanning signal.

2 Claims, 12 Drawing Sheets

DISPLAY DEVICE

CROSS-REFERENCE TO RELATED APPLICATION

The present application claims priority from Japanese application JP 2008-223808 filed on Sep. 1, 2008, the content of which is hereby incorporated by reference into this application.

BACKGROUND OF THE INVENTION

1. Field of the Invention

The present invention relates to an image display device which performs a display control of pixels using thin film transistors (TFT).

2. Description of the Related Art

Among image display devices such as a liquid crystal display device and an organic EL (Electro Luminescence) display device, for example, there has been known an image display device which performs a display control of each pixel by an active matrix method which uses a thin film transistor (see JP-A-2003-5709 (patent document 1) and JP-A-2003-122301 (patent document 2), for example). In such an image display device, the pixels are arranged in a matrix array, one scanning signal line is arranged for every pixel row of the pixel matrix, and one data signal line (image signal line) is arranged for every pixel column. Further, a pixel circuit which performs a display control of the pixel is arranged in each pixel. The pixel circuit includes at least one thin film transistor, the pixel circuit is connected to the scanning signal line via a gate electrode of the thin film transistor, and the pixel circuit is connected to the data signal line via either one of a source electrode and a drain electrode of the thin film transistor. In such an image display device, an ON/OFF operation of the thin film transistor is controlled by applying voltages to the scanning signal line and the data signal line corresponding to the pixel which is subject to a display control thus performing a display control of the pixel.

Here, one example of a pixel control in an organic EL display device of the related art is explained. FIG. 11 is a view showing one example of the schematic constitution of circuits formed on a substrate of the organic EL display device of the related art. FIG. 12 is a schematic view showing one example of signals inputted into a scanning signal line SEL, a reset signal line RES and a data signal line DTL. In FIG. 12, signals which are inputted into the respective signal lines during three horizontal periods H(n), H(n+1) and H(n+2) are shown. Symbol SEL(n) indicates the scanning signal lines SEL corresponding to the nth pixel row PLI counted from a signal drive circuit DDR side, and symbol RES(n) indicates a reset signal line RES corresponding to the nth pixel row PLI counted from the signal drive circuit DDR side. Assume that both a thin film transistor T1 whose ON/OFF operation is controlled by the scanning signal line SEL and a thin film transistor T2 whose ON/OFF operation is controlled by the reset signal line RES have the p-type channel structure. Accordingly, a high voltage of the scanning signal lines SEL and a high voltage of the reset signal line RES correspond to an OFF state of the thin film transistor T1 and an OFF state of the thin film transistor T2 respectively, while a low voltage of the scanning signal line SEL and a low voltage of the reset signal line RES correspond to an ON state of the thin film transistor T1 and an ON state of the thin film transistor T2 respectively.

The display control of the nth pixel row PLI is executed during the horizontal period H(n). To be more specific, first of all, the thin film transistors T1, T2 of the nth pixel row PLI are set to an ON state (Tx). Here, a reference voltage is applied to one side of a first pixel capacitor C1 from the data signal line DTL via the thin film transistor T1, and a reset voltage corresponding to a characteristic of a thin film transistor T3 and a characteristic of an organic light emitting diode element OLED is applied to an opposite side of the first pixel capacitor C1 and these voltages are stored in the first pixel capacitor C1. Here, irregularities of the thin film transistor T3 of each pixel are canceled. Thereafter, the thin film transistor T2 returns to an OFF state (Ty), a data signal voltage is applied to the data signal line DTL, and a differential between the reference voltage and the data signal voltage is applied to a gate of the thin film transistor T3 via the thin film transistor T1 in an ON state and the first pixel capacitor C1. An electric current which flows into the pixel is decided in accordance with the voltage applied to the gate of the thin film transistor T3, and the organic light emitting diode element OLED starts emission of light correspondingly to the electric current. Then, at timing at which the horizontal period H(n) is finished, the thin film transistor T1 returns to an OFF state (Tz). Here, the data signal voltage written in the pixel is continuously held in the second pixel capacitor C2 even after the thin film transistor T1 assumes an OFF state and hence, the organic light emitting diode element OLED continues emission of light with brightness corresponding to the data signal voltage written in the pixel. In the same manner, a display control of the (n+1)th pixel row PLI is executed during the next horizontal period H(n+1), and a display control of the (n+2) th pixel row PLI is executed during the next horizontal period H(n+2).

With respect to the organic EL display device, there may be a case where a display control of each pixel is performed such that 1 frame period (1/60 sec, for example) is divided into a writing period for writing a data signal voltage into each pixel (pixel circuit) and a light emission period for allowing each pixel to emit light (see patent document 2, for example)

SUMMARY OF THE INVENTION

In the above-mentioned image display device, there may be a case where display quality is lowered due to transmission delay or voltage drop of a scanning signal as explained below.

For example, in realizing a large-sized display device in which a large number of pixels are arranged by an active matrix method, in a pixel which is positioned remote from a gate drive circuit for inputting a scanning signal, the transmission delay of a scanning signal occurs resulting in possible lowering of display quality. For example, in the organic EL display device shown in FIG. 11, in a pixel which is positioned remote from a gate drive circuit GDR, image data cannot be normally written resulting in the possible occurrence of irregularities on a display screen.

FIG. 13A shows one example of a scanning signal or a reset signal supplied to the pixel positioned relatively close to the gate drive circuit GDR (hereinafter referred to as "first pixel"), and FIG. 13B shows one example of a scanning signal or a reset signal supplied to the pixel positioned relatively remote from the gate drive circuit GDR (hereinafter referred to as "second pixel"). In FIG. 13A and FIG. 13B, symbol Vth indicates a threshold voltage of the thin film transistor T1 or T2. As shown in FIG. 13A and FIG. 13B, the rise of the scanning signal or the reset signal in the second pixel is gentle compared to the rise of the scanning signal or the reset signal in the first pixel and hence, timing at which the thin film transistors T1, T2 are changed to an ON state is delayed. As a result, a time Ton during which the thin film transistors T1, T2 assume an ON state in the second pixel becomes short compared to the first pixel. When the time Ton in which the thin film transistor T1, T2 assumes an ON state becomes short, a time necessary for performing processing which allows the first pixel capacitor C1 to hold the data signal voltage becomes short and hence, the data signal voltage cannot be normally held in the first pixel capacitor C1. As a result, the organic light emitting diode element OLED cannot emit light with brightness corresponding to image data.

Further, for example, in the organic EL display device which adopts a method where a display control of each pixel is performed by dividing 1 frame period into a writing period and a light emission period, compared to a case which adopts a method where a pixel emits light during most of 1 frame period, a writing time is liable to become short and, at the same time, a larger amount of electric current flows during the light emission period and hence, a larger voltage drop occurs. As a result, there may be a case where irregularities occur on a display screen.

The invention has been made to overcome the above-mentioned drawbacks, and it is an object of the invention to provide an image display device which can alleviate lowering of display quality attributed to transmission delay or voltage drop of a scanning signal, for example.

To overcome the above-mentioned drawbacks, according to one aspect of the invention, there is provided an image display device which includes a substrate on which pixel circuits for performing a display control of pixels are arranged in a matrix array, wherein a plurality of data signal lines each of which is connected to at least one pixel circuit in one pixel circuit column and is not connected to the pixel circuits of other pixel circuit columns are provided to one pixel circuit column, and the pixel circuits in the pixel circuit columns are connected to any one of the plurality of data signal lines.

DESCRIPTION OF THE PREFERRED EMBODIMENT

Figure 1:
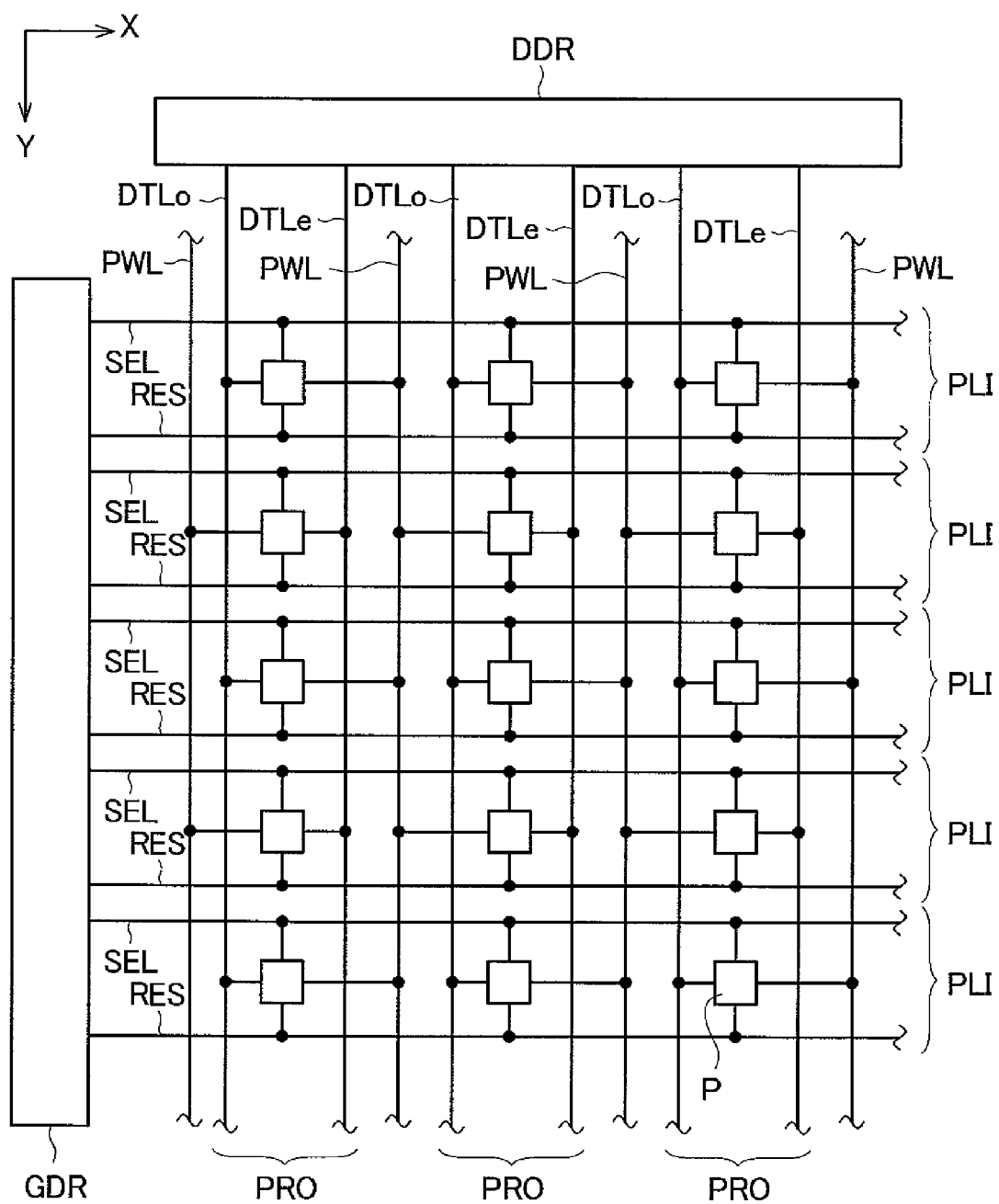
FIG. 1 is a view showing the schematic constitution of circuits formed on a glass substrate of an image display device according to a first embodiment of the invention.

In an image display device according to the invention which includes a substrate on which pixel circuits for performing a display control of pixels are arranged in a matrix array, a plurality of data signal lines each of which is connected to at least one pixel circuit in one pixel circuit column and is not connected to the pixel circuits in other pixel circuit columns are provided to said one pixel circuit column, and the pixel circuits in the pixel circuit column are connected to any one of the plurality of data signal lines.

Further, according to one mode of the invention, the plurality of data signal lines may include a first data signal line and a second data signal line, the pixel circuits which belong to a first pixel circuit row out of the pixel circuits in the pixel circuit column may be connected to the first data signal line and the pixel circuits which belong to a second pixel circuit row out of the pixel circuits in the pixel circuit column may be connected to the second data signal line, and a signal which brings thin film transistors into an ON state may be supplied to both the first pixel circuit row and the second pixel circuit row within a predetermined period.

Further, according to another mode of the invention, the plurality of data signal lines may include a first data signal line and a second data signal line, the pixel circuits which belong to a first pixel circuit row out of the pixel circuits in the pixel circuit column may be connected to the first data signal line, and the pixel circuits which belong to a second pixel circuit row out of the pixel circuits in the pixel circuit column may be connected to the second data signal line, a data signal voltage may be supplied to the pixel circuits in the first pixel circuit row via the first data signal line during a first period, a predetermined signal may be supplied to the first data signal line during a second period so that light emitting elements included in the pixel circuits in the first pixel circuit row emit light correspondingly to the data signal voltage supplied to the pixel circuits in the first pixel circuit row during the first period, and a data signal voltage may be supplied to the pixel circuits in the second pixel circuit row via the second data signal line.

Further, according to another mode of the invention, the number of pixel circuits which are connected to each of the plurality of data signal lines maybe substantially equal between or among the plurality of data signal lines.

Further, according to another mode of the invention, the plurality of data signal lines may be constituted of a first data signal line and a second data signal line, and the pixel circuits which are connected to the first data signal line and the pixel circuits which are connected to the second data signal line may be arranged alternately.

Further, according to another mode of the invention, the plurality of data signal lines may be constituted of a first data signal line and a second data signal line, and the pixel circuits may be connected to either one of the first data signal line and the second data signal line, and thin film transistors maybe arranged in a region defined between the first data signal line and the second data signal line as viewed in a plan view of the substrate.

Further, according to another mode of the invention, a power source line may be arranged on both sides of the pixel circuit column, and the pixel circuits of the pixel circuit column may be connected to the power source line which is arranged on a side opposite to a side where the data signal line to which the pixel circuits are connected is arranged.

Further, according to another mode of the invention, there is provided an image display device including a substrate on which pixel circuits for performing a display control of pixels are arranged in a matrix array, wherein a data signal line is arranged along one pixel circuit column formed of the pixel circuits arranged in a matrix array, and one pixel circuit column has pixel circuits which are connected to the data signal line and the pixel circuits which are not connected to the data signal line.

Further, according to another mode of the invention, a plurality of data signal lines may be provided to one pixel circuit column with respect to the data signal lines, the pixel circuits in one pixel circuit column may be connected to each one of the plurality of data signal lines, and the number of pixel circuits which are connected to the plurality of data signal lines respectively may be equal between or among the plurality of data signal lines.

Further, according to another mode of the invention, there is provided an image display device including a substrate on which pixel circuits for performing a display control of pixels are arranged in a matrix array, wherein a plurality of data signal lines may be provided for one pixel circuit column, and the plurality of data signal lines may extend in the columnar direction of the pixel circuits arranged in a matrix array and may be arranged parallel to each other in the row direction, and the pixel circuits in the pixel circuit column may be connected to any one of the plurality of data signal lines.

Further, according to another mode of the invention, the plurality of data signal lines may include a first data signal line and a second data signal line along a first pixel circuit column, and the first data signal line and the second data signal line maybe arranged parallel to each other, and the first pixel circuit column may have the pixel circuits which are connected to the first data signal line and the pixel circuits which are connected to the second data signal line.

Further, according to another mode of the invention, the pixel circuit may be connected to either one of the first data signal line and the second data signal line via a thin film transistor, and the thin film transistor may be arranged in a region defined between the first data signal line and the second data signal line as viewed in a plan view of the substrate.

Further, according to another mode of the invention, a power source line may be arranged on both sides of the pixel circuit column, and the pixel circuits of the pixel circuit column maybe connected to the power source line which is arranged on a side opposite to a side where the data signal line to which the pixel circuits are connected is arranged.

Further, according to another mode of the invention, the pixel circuits which belong to a first pixel circuit row out of the pixel circuits in the first pixel circuit column may be connected to the first data signal line and the pixel circuits which belong to a second pixel circuit row out of the pixel circuits in the first pixel circuit column may be connected to the second data signal line.

Further, according to another mode of the invention, a signal which brings thin film transistors into an ON state may be supplied to both the first pixel circuit row and the second pixel circuit row within a predetermined period.

Further, according to another mode of the invention, the pixel circuits which belong to a first pixel circuit row out of the pixel circuits in the pixel circuit column may be connected to the first data signal line, and the pixel circuits which belong to a second pixel circuit row out of the pixel circuits in the pixel circuit column may be connected to the second data signal line, a data signal voltage may be supplied to the pixel circuits in the first pixel circuit row via the first data signal line during a first period, a predetermined signal may be supplied to the first data signal line during a second period so that light emitting elements included in the pixel circuits in the first pixel circuit row emit light correspondingly to the data signal voltage supplied to the pixel circuits in the first pixel circuit row during the first period, and a data signal voltage may be supplied to the pixel circuits in the second pixel circuit row via the second data signal line.

According to the invention, for example, it is possible to alleviate the lowering of display quality attributed to transmission delay or voltage drop of the scanning signal.

Preferred embodiments of the invention are explained hereinafter in detail in conjunction with drawings.

[First Embodiment]

Here, the explanation is made with respect to one example in which the invention is applied to an organic EL display device which constitutes one mode of an image display device. In a display panel of the image display device according to this embodiment, first electrodes (for example, anodes), organic EL thin film layers and second electrodes (for example, cathodes) are formed on a glass substrate on which thin film transistors are formed.

FIG. 1 is a view showing the schematic constitution of circuits formed on the glass substrate of the image display device according to this embodiment. As shown in FIG. 1, a plurality of scanning signal lines SEL is arranged substantially in parallel to each other on the glass substrate. In an image display region, scanning signal lines SEL extend in the first direction (X direction). The scanning signal lines SEL are connected to a gate drive circuit GDR. Further, a plurality of reset signal lines RES are also arranged substantially in parallel to the scanning signal lines SEL on the glass substrate. The reset signal lines RES also extend in the first direction (X direction). The reset signal lines RES are also connected to the gate drive circuit GDR. The plurality of scanning signal lines SEL and the plurality of reset signal lines RES are arranged along the second direction (Y direction) orthogonal to the first direction (X direction). Voltages are selectively applied to the scanning signal lines SEL and the reset signal lines RES for every predetermined timing from the gate drive circuit GDR.

Further, a plurality of data signal lines DTLo and a plurality of data signal lines DTLe are arranged on the glass substrate. In the image display region, the plurality of data signal lines DTLo and the plurality of data signal lines DTLe extend in the second direction (Y direction), and are arranged parallel to each other along the first direction (X direction) orthogonal to the second direction (Y direction). As viewed in a plan view, the data signal lines DTLo, DTLe substantially orthogonally intersect with the plurality of scanning signal lines SEL and the plurality of reset signal lines RES. The data signal lines DTLo, DTLe are connected to a signal drive circuit DDR. Voltages corresponding to image data to be displayed on the image display device are applied to the data signal lines DTLo, DTLe for every predetermined timing by the signal drive circuit DDR. Further, a plurality of power source lines PWL is arranged on the glass substrate. The plurality of power source lines PWL extend in the second direction (Y direction), and are arranged parallel to each other along the first direction (X direction) orthogonal to the second direction (Y direction). As viewed in a plan view, the power source lines PWL substantially orthogonally intersect with the plurality of scanning signal lines SEL and the plurality of reset signal lines RES.

Respective areas in the vicinity of portions where the scanning signal lines SEL intersect with the data signal lines DTLo, DTLe correspond to pixels of the image display device. That is, respective pixels arranged in a matrix array are defined by the scanning signal lines SEL and the data signal lines DTLo, DTLe. A pixel circuit P for performing a display control of the pixel is arranged in a pixel region of each pixel. Hereinafter, a set of pixels (pixel circuits P) which extends and is arranged in the lateral direction (X direction or a row direction) is referred to as a pixel row PLI (pixel circuit row), and a set of pixels (pixel circuits P) which extends and is arranged in the longitudinal direction (Y direction or a columnar direction) is referred to as a pixel column PRO (pixel circuit column).

In this embodiment, one scanning signal line SEL and one reset signal line RES are arranged for every pixel row PLI. The pixel circuit P is connected to both the scanning signal lines SEL and the reset signal line RES.

Further, in this embodiment, two data signal lines DTLo, DTLe are arranged parallel to each other for every pixel column PRO. To the data signal lines DTLo, DTLe arranged in one pixel column PRO, only the pixel circuits P of the pixel column PRO are connected and the pixel circuits P of other pixel columns PRO are not connected. That is, the data signal lines DTLo, DTLe are not used in common between the different pixel columns PRO.

In the example shown in FIG. 1, the data signal line DTLo is arranged on one side (left side) of the pixel column PRO, and the data signal line DTLe is arranged on the other side (right side) of the pixel column PRO. That is, the pixel column PRO is arranged between two data signal lines DTLo, DTLe. The pixel circuits P are connected to either one of the data signal lines DTLo, DTLe. To be more specific, the data signal line DTLo corresponds to a group of odd-numbered pixel rows PLI counted from a signal drive circuit DDR side, and the pixel circuits P which belong to the odd-numbered pixel row PLI are connected to the data signal line DTLo. On the other hand, the data signal line DTLe corresponds to a group of even-numbered pixel rows PLI counted from the signal drive circuit DDR side, and the pixel circuits P which belong to the even-numbered pixel row PLI are connected to the data signal line DTLe. Accordingly, in the pixel column PRO, the pixel circuits P which are connected to the data signal line DTLo and the pixel circuits P which are connected to the data signal line DTLe are arranged alternately. Further, the number of pixel circuits P which are connected to the data signal line DTLo and the number of pixel circuits P which are connected to the data signal line DTLe are substantially equal.

Further, in this embodiment, the power source lines PWL are arranged on both sides of the pixel column PRO. One power source line PWL is arranged between the pixel column PRO and the pixel column PRO arranged adjacent to the former pixel column PRO. The power source line PWL is used in common by the pixel columns PRO arranged on both sides of the power source line PWL. The pixel circuits P of the pixel column PRO are connected to either one of the power source lines PWL arranged on both sides of the pixel column PRO. To be more specific, the pixel circuits P are connected to the power source line PWL arranged on a side opposite to the side where the data signal line DTLo or DTLe to which the pixel circuits P are connected is arranged. Due to such a constitution, in the pixel column PRO, the pixel circuits P which are connected to one of power source lines PWL arranged on both sides of the pixel column PRO and the pixel circuits P which are connected to the other of the power source lines PWL arranged on both sides of the pixel column PRO are arranged alternately. Further, the number of pixel circuits P which are connected to one power source line PWL and the number of pixel circuits P which are connected to the other power source line PWL are substantially equal.

Figure 2:
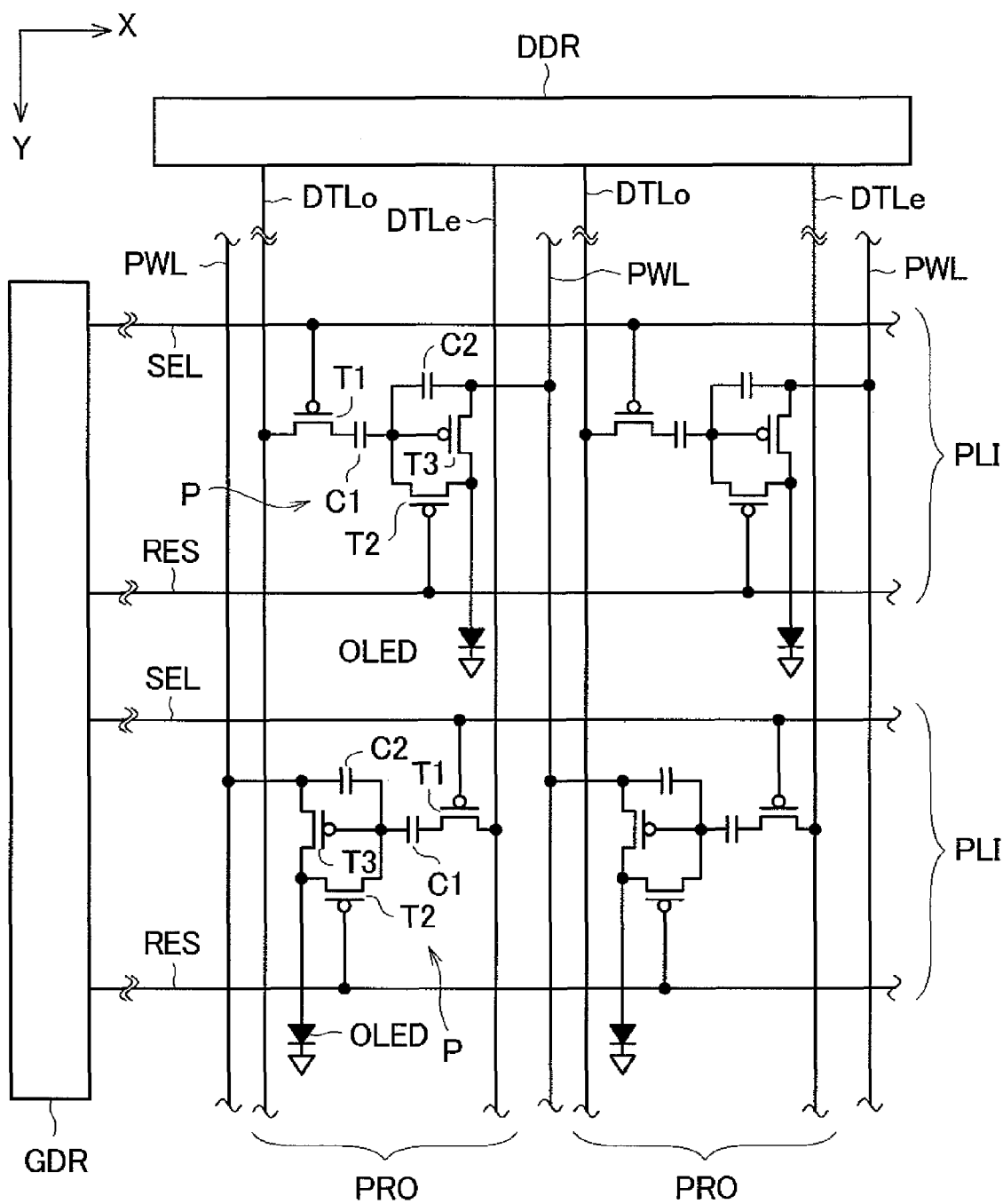
FIG. 2 is a view showing the schematic constitution of pixel circuits.
Figure 3:
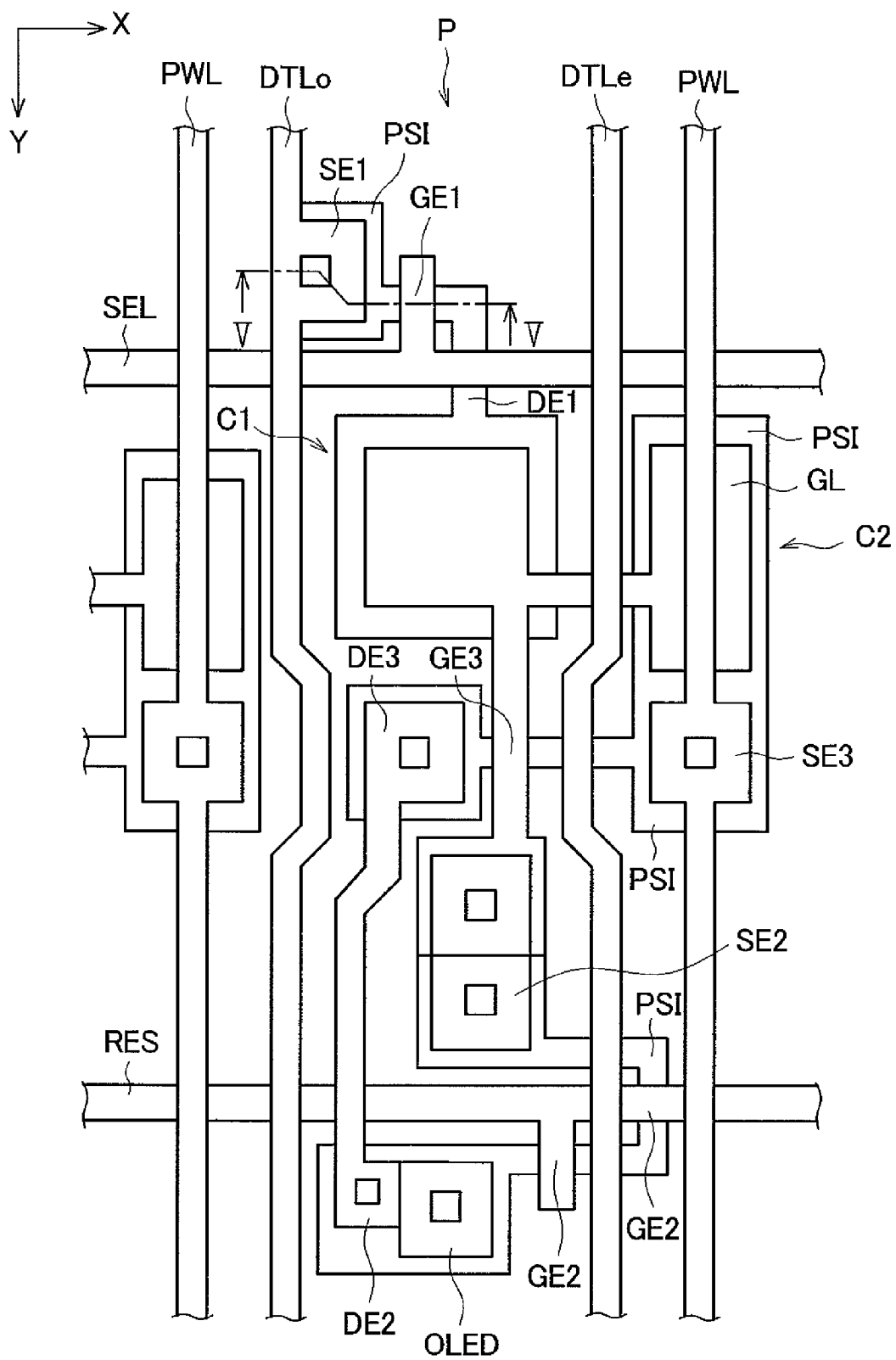
FIG. 3 is a layout view of a pixel on an odd-numbered pixel row.
Figure 4:
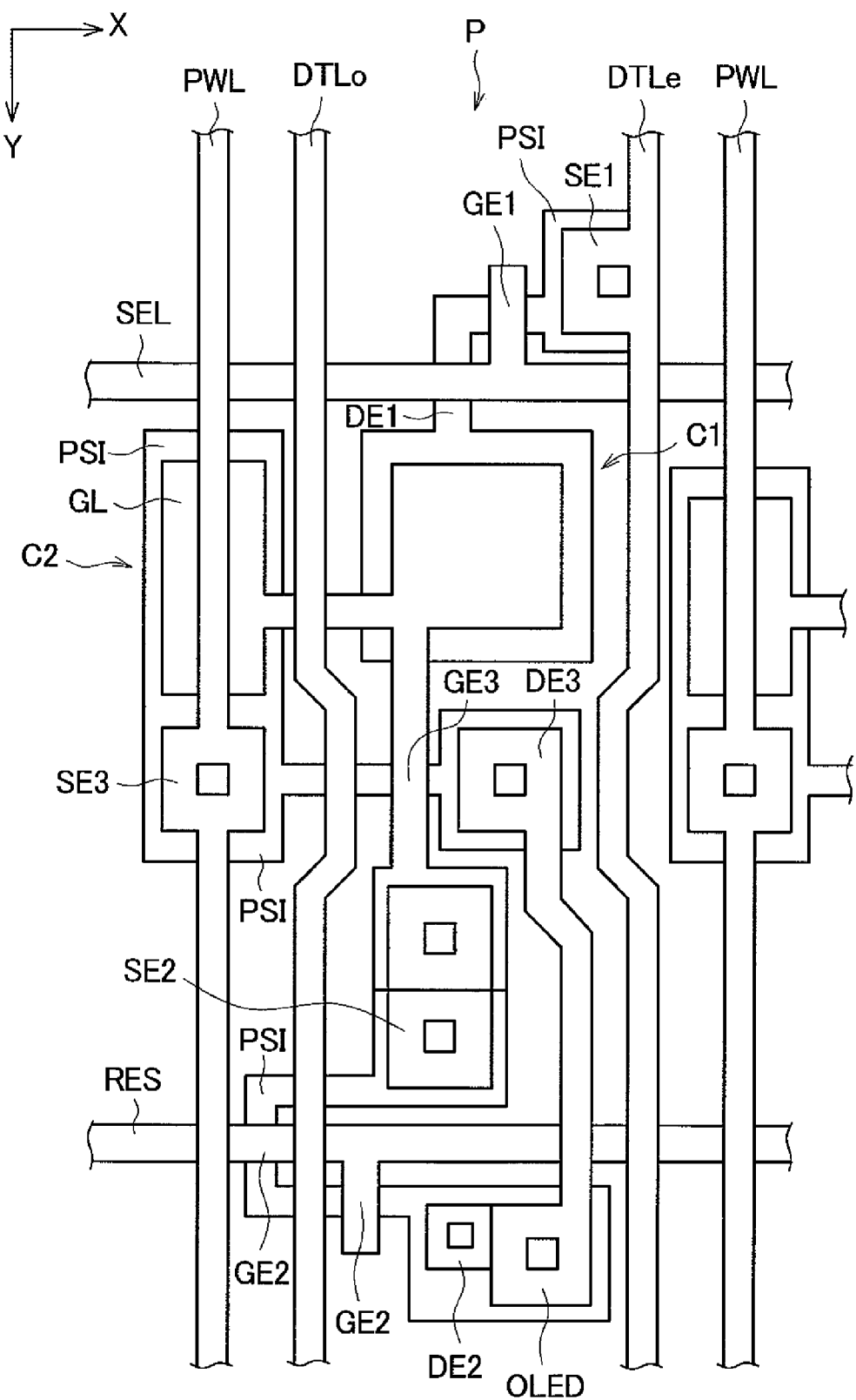
FIG. 4 is a layout view of a pixel on an even-numbered pixel row.

The pixel circuits P are explained in further detail in conjunction with FIG. 2 to FIG. 4. FIG. 2 shows the schematic constitution of the pixel circuits P provided to the respective pixel regions. In FIG. 2, four pixel regions which are arranged adjacent to each other in the longitudinal direction as well as in the lateral direction are described. In FIG. 2, assume that the pixel row PLI on an upper side is the odd-numbered pixel row PLI counted from the signal drive circuit DDR side, and the pixel row PLI on a lower side is the even-numbered pixel row PLI counted from the signal drive circuit DDR side. FIG. 3 is a layout view of the pixels on the odd-numbered pixel row PLI, and FIG. 4 is a layout view of the pixel on the even-numbered pixel row PLI. In FIG. 3 and FIG. 4, symbol "GL" indicates gate lines.

As shown in FIG. 2, each pixel circuit P includes thin film transistors T1, T2, T3, a first pixel capacitor C1, a second pixel capacitor C2 and an organic light emitting diode element OLED. The thin film transistors T1, T2, T3 are formed of a p-channel polycrystalline-silicon thin film transistor. The organic light emitting diode element OLED may be also referred to as an organic EL (Electro-Luminescent) element.

As shown in FIG. 2 to FIG. 4, a gate electrode GE1 of the thin film transistor T1 is connected to the scanning signal lines SEL. Further, either one of source electrode SE1 and the drain electrode DE1 of the thin film transistor T1 (here, source electrode SE1) is connected to either one of the data signal lines DTLo, DTLe. The source electrode SE1 of the thin film transistor T1 of the pixel circuit P belonging to the odd-numbered pixel row PLI is connected to the data signal line DTLo, and the source electrode SE1 of the thin film transistor T1 of the pixel circuit P belonging to the even-numbered pixel row PLI is connected to the data signal line DTLe.

As shown in FIG. 3 and FIG. 4, as viewed in a plan view, the thin film transistor T1 is formed such that the gate electrode GE1, the source electrode SE1, the drain electrode DE1 and a semiconductor layer PSI of the thin film transistor T1 are positioned within a region defined between the data signal line DTLo and the data signal line DTLe. Further, a projecting portion is formed on the scanning signal lines SEL in an overlapping manner with the semiconductor layer PSI, and this projecting portion functions as the gate electrode GE1 of the thin film transistor T1.

Figure 5:
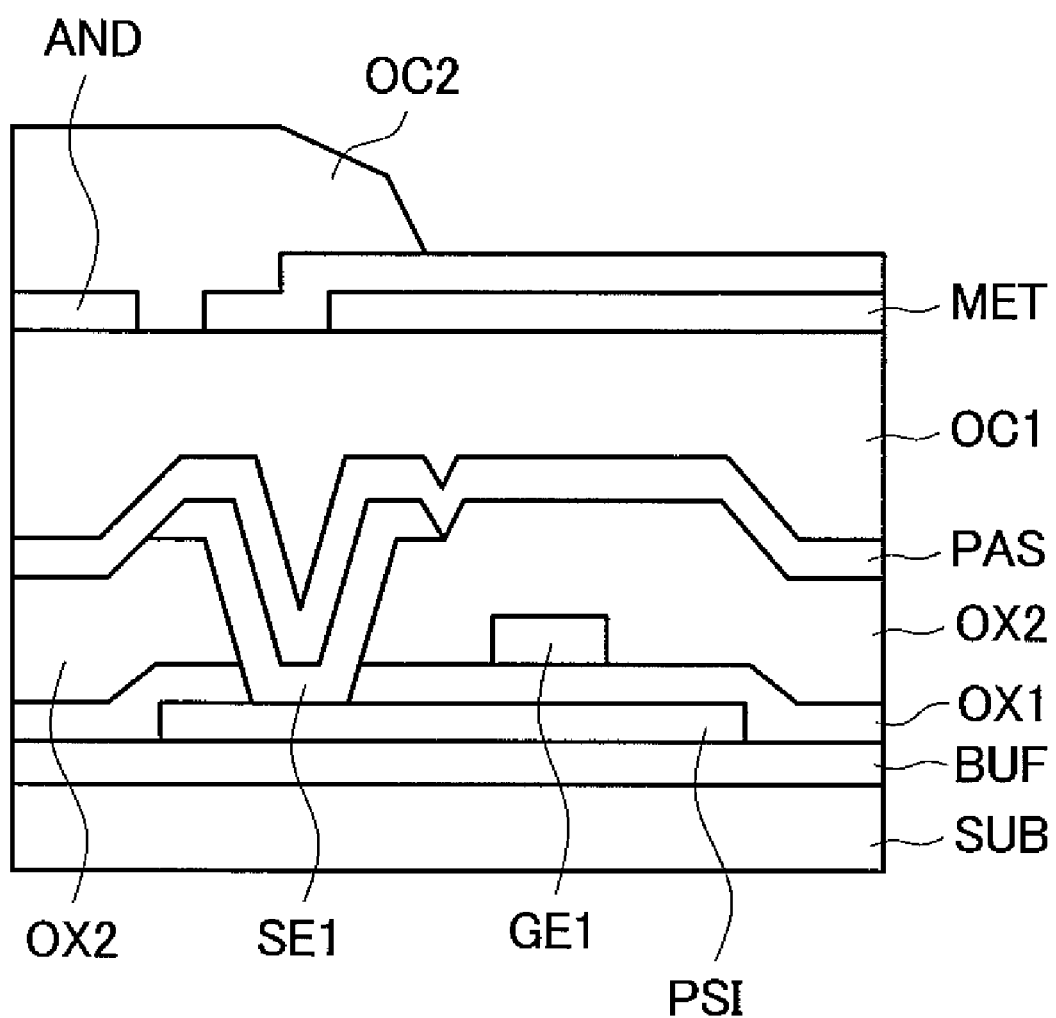
FIG. 5 is a schematic view showing a cross-section of a portion of the glass substrate.

FIG. 5 is a schematic view showing a mode of across section of the glass substrate taken along a line V-V in FIG. 3. That is, FIG. 5 shows a mode of a cross section of a portion of the glass substrate where the thin film transistor T1 is formed. As shown in FIG. 5, on the glass substrate SUB, a buffer layer BUF, the semiconductor layer PSI, a gate insulation film OX1, a gate line layer, an interlayer insulation film OX2, a source/drain line layer, a protective insulation film PAS, a leveling film OC1, a reflection metal layer MET, an anode layer AND and a leveling film OC2 are stacked sequentially. Here, the buffer layer BUF is a layer which contains silicon oxide. The semiconductor layer PSI is a layer which contains polysilicon, for example. The gate line layer is a layer which includes the gate electrode GE1, the gate line GL, the scanning signal lines SEL and the like. Further, the source/drain line layer is a layer which includes the source electrode SE1, the drain electrode DE1, the data signal lines DTLo, DTLe and the like. Such stacked structure is formed using a photolithography technique, for example.

As shown in FIG. 2 to FIG. 4, the gate electrode GE2 of the thin film transistor T2 is connected to the reset signal line RES. As shown in FIG. 3 and FIG. 4, a projecting portion is formed on the reset signal line RES in an overlapping manner with the semiconductor layer PSI, and this projecting portion functions as the gate electrode GE2 of the thin film transistor T2. Further, as viewed in a plan view of the substrate, the semiconductor layer PSI is formed in an intersecting manner with the reset signal line RES, and a portion of the reset signal line RES which intersects with the semiconductor layer PSI also functions as the gate electrode GE2 of the thin film transistor T2.

As shown in FIG. 2 to FIG. 4, the data signal line DTLo, DTLe is connected to the first pixel capacitor C1 via the thin film transistor T1. The other end of the first pixel capacitor C1 is connected to a gate electrode GE3 of the thin film transistor T3 and the source electrode SE2 of the thin film transistor T2. The gate electrode GE3 of the thin film transistor T3 is connected to a source electrode SE3 of the thin film transistor T3 via a second pixel capacitor C2, and a source electrode SE3 of the thin film transistor T3 is connected to the power source line PWL. A drain electrode DE3 of the thin film transistor T3 and a drain electrode DE2 of the thin film transistor T2 are connected to one end of the organic light emitting diode element OLED. The other end of the organic light emitting diode element OLED is connected to a common ground terminal (cathode)

As described above, in this embodiment, two data signal lines DTLo, DTLe are provided for one pixel column PRO. Then, the pixel circuits P which belong to the odd-numbered pixel row PLI are connected to the data signal line DTLo, and the pixel circuits P which belong to the even-numbered pixel row PLI are connected to the data signal line DTLe. As a result, it is possible to execute a display control for the odd-numbered pixel rows PLI and a display control for the even-numbered pixel rows PLI in parallel. Since the parallel execution of the display control for the odd-numbered pixel rows PLI and the even-numbered pixel rows PLI can be realized, it is possible to execute the display control for one pixel row PLI using two continuous horizontal periods. This operation is explained hereinafter.

Figure 6:
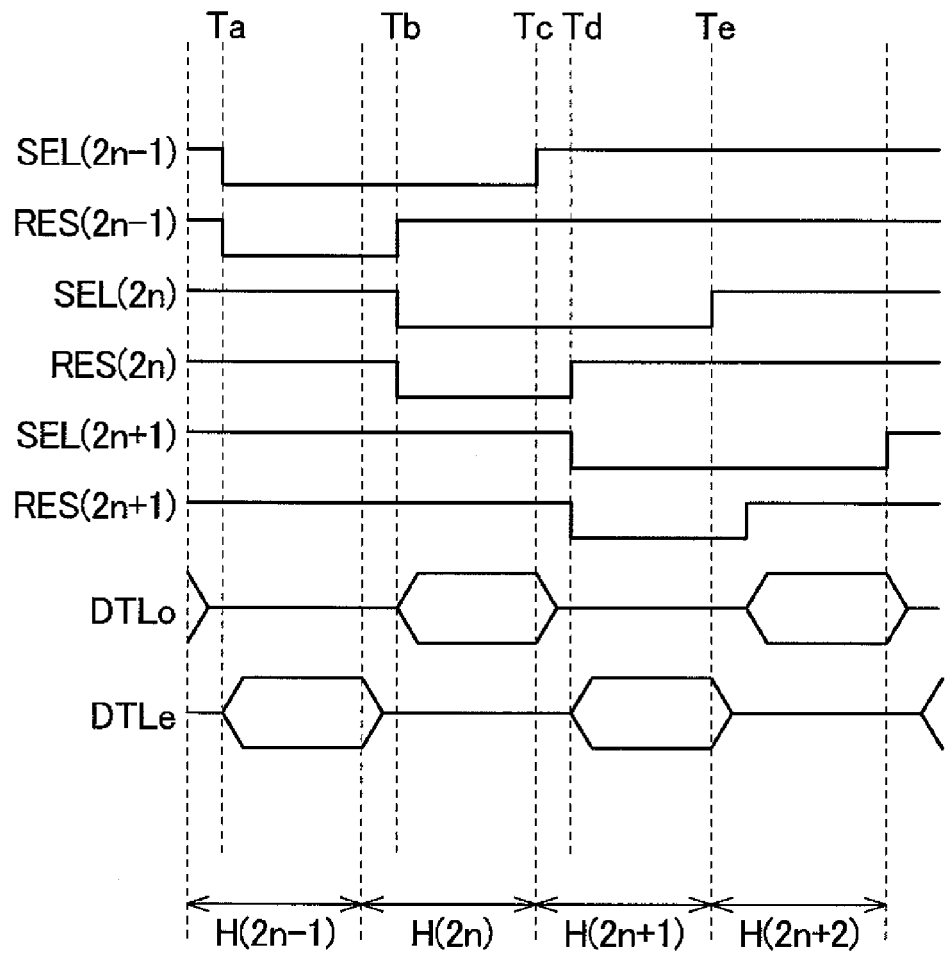
FIG. 6 is a schematic view showing one example of signals inputted into a scanning signal line, a reset signal line and a data signal line.

FIG. 6 is a schematic view showing signals inputted into the scanning signal lines SEL, the reset signal line RES and the data signal lines DTLo, DTLe. FIG. 6 mainly shows signals inputted into the respective signal lines during four horizontal periods H(2n−1), H(2n), H(2n+1), H(2n+2). Here, symbol SEL(2n−1) indicates a scanning signal line SEL corresponding to the (2n−1) th pixel row PLI, and symbol RES (2n−1) indicates a reset signal line RES corresponding to the (2n−1)th pixel row PLI. Further, the nth pixel row PLI is described as the pixel row PLI(n) hereinafter.

For example, in two continuous horizontal periods H(2n−1), H(2n), the display control of the pixel row PLI(2n−1) is executed as explained below.

First of all, during the horizontal period H(2n−1), signals for bringing the thin film transistors T1, T2 into an ON state are inputted into the scanning signal lines SEL (2n−1), and the reset signal line RES (2n−1) corresponding to the pixel row PLI(2n−1) (Ta). When the thin film transistors T1, T2 assume an ON state, resetting of the first pixel capacitor C1 is executed. That is, a reference voltage and a reset voltage are written in both sides of the first pixel capacitor C1 so as to allow the thin film transistors T1, T2 to prepare for inputting of the data signal voltage.

Thereafter, during the horizontal period H(2n), a signal for bringing the thin film transistor T2 into an OFF state is inputted into the reset signal line RES(2n−1), and the thin film transistor T2 returns to an OFF state (Tb). Then, a data signal voltage is applied to the data signal line DTLo corresponding to the odd-numbered pixel row PLI. Here, the data signal voltages which are applied to the respective data signal lines DTLo are set for the respective data signal lines DTLo based on image data. The pixel row PLI (2n−1) is the odd-numbered pixel row PLI and hence, in this case, the data signal voltage is inputted into the pixel circuit P of the pixel row PLI (2n−1) from the data signal line DTLo via the thin film transistor T1 in an ON state, and a differential between the reference voltage and the data signal voltage is applied to the gate of the thin film transistor T3.

Then, a drive current corresponding to the data signal voltage written in the pixel is inputted into the organic light emitting diode element OLED via the thin film transistor T3. Then, the organic light emitting diode element OLED starts emission of light with brightness corresponding to the data signal voltage written in the pixel. Thereafter, at timing at which the horizontal period H(2n) is finished, a signal for bringing the thin film transistor T1 into an OFF state is inputted into the scanning signal lines SEL (2n−1) (Tc). The data signal voltage written in the pixel is continuously held in the second pixel capacitor C2 even after the thin film transistor T1 assumes an OFF state and hence, the organic light emitting diode element OLED continues emission of light with brightness corresponding to the data signal voltage written in the pixel.

Further, a display control of the pixel row PLI (2n) is executed during the horizontal period H(2n) and the horizontal period H(2n+1) which follows the horizontal period H(2n).

First of all, during the horizontal period H(2n), signals for bringing the thin film transistors T1, T2 into an ON state are inputted into the scanning signal lines SEL(2n), and the reset signal line RES(2n) corresponding to the pixel row PLI(2n) so that resetting of the first pixel capacitor C1 is executed (Tb). Timing Tb is also timing at which writing of the data signal voltage into the pixels on the pixel row PLI(2n−1) starts. That is, when timing Tb comes, writing of the data voltage signal into the pixel row PLI (2n−1) and resetting of the pixel row PLI(2n) start in parallel. That is, during the horizontal period H (2n), the signal for bringing the thin film transistor T1 into an ON state is inputted into both the scanning signal lines SEL(2n−1) corresponding to the pixel row PLI(2n−1) and the scanning signal lines SEL(2n) corresponding to the pixel row PLI(2n) and hence, a display control for the pixel row PLI (2n−1) and a display control for the pixel row PLI (2n) are executed in parallel.

Thereafter, during the horizontal period H(2n+1), a signal for bringing the thin film transistor T2 into an OFF state is inputted into the reset signal line RES (2n), and the thin film transistor T2 returns to an OFF state (Td). In this case, resetting of the first pixel capacitor C1 on the pixel row PLI (2n) is finished and writing of the data signal voltage to the pixels on the pixel row PLI(2n) starts. That is, the data signal voltage is inputted into the data signal line DTLe corresponding to the even-numbered pixel rows PLI. The pixel row PLI (2n) is the even-numbered pixel row PLI and hence, in this case, the data signal voltage is inputted into the pixel circuit P on the pixel row PLI (2n) from the data signal line DTLe via the thin film transistor T1 in an ON state, and the data signal voltage is written in the pixel. Then, the organic light emitting diode element OLED on the pixel row PLI (2n) starts emission of light with brightness corresponding to the data signal voltage written in the pixel. Thereafter, at timing at which the horizontal period H(2n+1) is finished, a signal for bringing the thin film transistor T1 into an OFF state is inputted into the scanning signal lines SEL(2n) (Te).

At timing at which writing of the data signal voltage into the pixel on the pixel row PLI(2n) starts, resetting of the first pixel capacitor C1 on the pixel row PLI (2n+1) starts (Td). That is, during the horizontal period H(2n+1), writing of the data signal voltage into the pixel row PLI(2n) and resetting of the pixel row PLI (2n+1) are executed in parallel.

As described above, in this embodiment, two data signal lines consisting of the data signal line DTLo corresponding to the odd-numbered pixel row PLI and the data signal line DTLe corresponding to the even-numbered pixel row PLI are provided for every pixel column PRO. As a result, it is possible to execute the display control for the odd-numbered pixel row PLI and the display control for the even-numbered pixel row PLI in parallel during one horizontal period. Further, due to the provision of two data signal lines, it is possible to execute the display control for one pixel row PLI using not only one horizontal period but also two horizontal periods. Accordingly, it is possible to input the signals for bringing the thin film transistors T1, T2 into an ON state into the scanning signal lines SEL and the reset signal line RES over a relatively long time.

Figure 7:
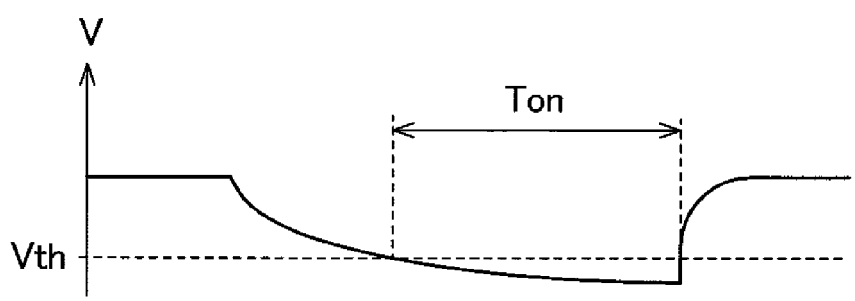
FIG. 7 is a view showing one example of a scanning signal or a reset signal.

FIG. 7 shows one example of a scanning signal or a reset signal in the pixel positioned remote from the gate drive circuit GDR. As described above, in this embodiment, it is possible to input the signal for bringing the thin film transistors T1, T2 into an ON state into the scanning signal lines SEL and the reset signal line RES over a relatively long time. Accordingly, even when the rise of the signal is gentle as shown in FIG. 7, time Ton for bringing the thin film transistors T1, T2 into an ON state is prolonged. Accordingly, it is possible to allow the pixel to ensure time necessary for processing for holding the data signal voltage therein. According to the image display device of this embodiment, the data signal voltage can be normally written so that lowering of display quality attributed to transmission delay of the scanning signal can be alleviated.

Further, according to the image display device of this embodiment, as viewed in a plan view of the substrate, the pixel circuit P (thin film transistor T1) is arranged in a region defined between the data signal line DTLo and the data signal line DTLe. In this embodiment, it is necessary to arrange two kinds of pixel circuits P consisting of the pixel circuits P which are connected to the data signal line DTLo and the pixel circuits P which are connected to the data signal line DTLe on the substrate. In this respect, according to this embodiment, two kinds of pixel circuits P can be formed with a preferable layout. For example, it is possible to reduce a space necessary for forming two kinds of pixel circuits P.

Further, according to the image display device of this embodiment, as viewed in a plan view of the substrate, the power source line PWL is arranged on both sides of the pixel column PRO. The pixel circuits P are connected to the power source line PWL arranged on the side opposite to the side where the data signal line to which the pixel circuits P are connected is arranged. Due to such a constitution, it is possible to suitably form two kinds of pixel circuits P consisting of the pixel circuits P which are connected to the data signal line DTLo and the power source line PWL and the pixel circuits P which are connected to the data signal line DTLe and the power source line PWL. For example, it is possible to reduce a space necessary for forming two kinds of pixel circuits P.

[Second Embodiment]

Here, the explanation is made with respect to another example in which the invention is applied to an organic EL display device which constitutes one mode of an image display device. In the same manner as the first embodiment, also in a display panel of the image display device according to this embodiment, first electrodes (for example, anodes), organic EL thin film layers and second electrodes (for example, cathodes) are formed on a glass substrate on which thin film transistors are formed.

Figure 8:
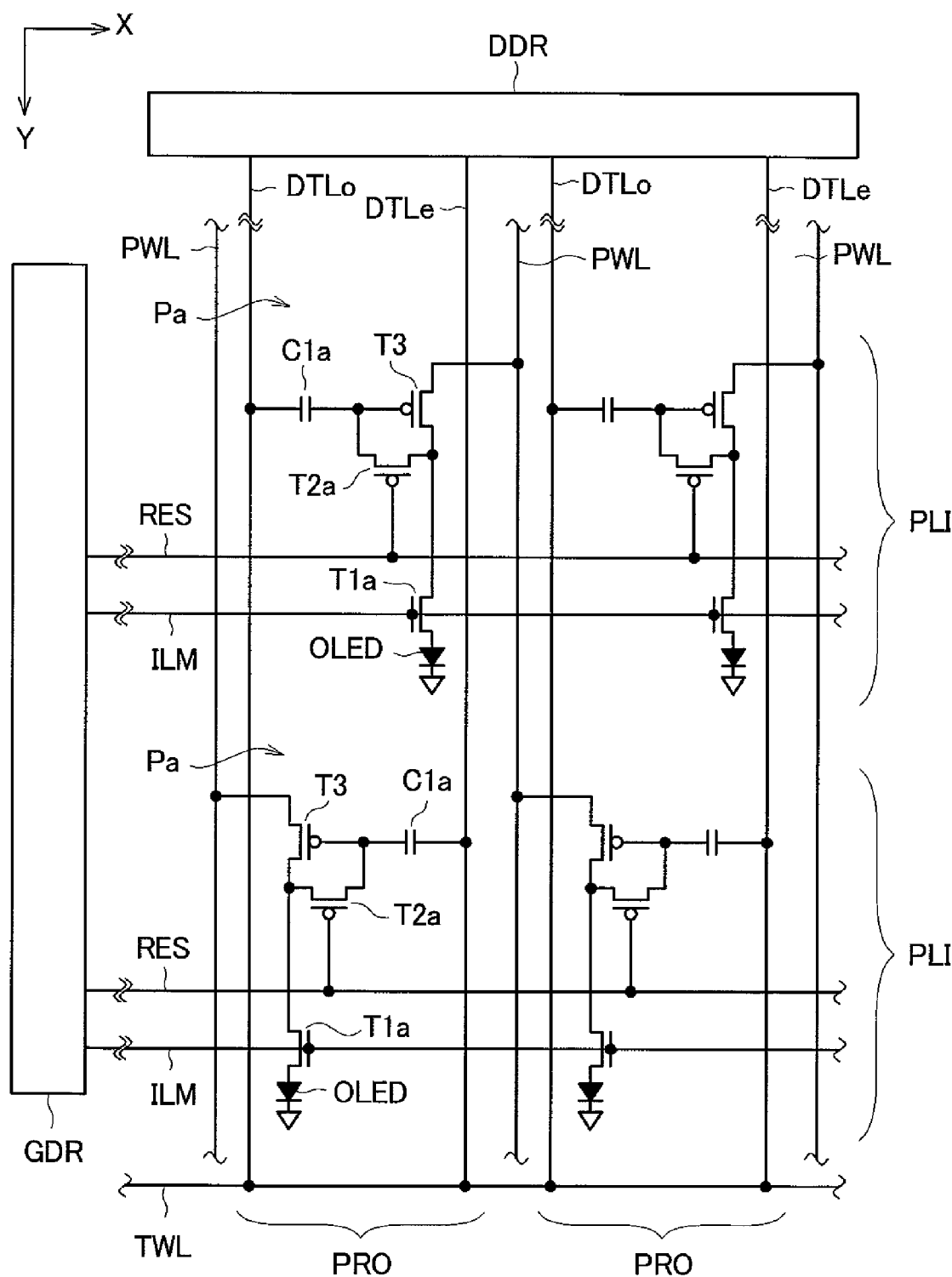
FIG. 8 is a view showing the schematic constitution of circuits formed on a glass substrate of an image display device according to a second embodiment of the invention.

FIG. 8 is a view showing the schematic constitution of circuits formed on the glass substrate of the image display device according to this embodiment. In this embodiment, in place of the scanning signal lines SEL in the first embodiment, light emitting control lines ILM are arranged. The light emitting control lines ILM are connected to a gate drive circuit GDR. Further, the light emitting control lines ILM extend in the first direction (X direction) in substantially parallel to reset signal lines RES, and intersect with data signal lines DTLo, DTLe and power source lines PWL substantially orthogonally. The plurality of light emitting control lines ILM are arranged parallel to each other in the second direction (Y direction) which is orthogonal to the first direction (X direction). One light emitting control line ILM is arranged for every pixel row PLI. Further, in this embodiment, a triangular-wave voltage inputting line TWL is arranged. The triangular-wave voltage inputting line TWL is connected to the data signal lines DTLo, DTLe, and inputs triangular-wave voltage to the data signal lines DTLo, DTLe at predetermined timing. The reset signal lines RES, the data signal lines DTLo, DTLe and the power source lines PWL are substantially equal to those lines used in the first embodiment and hence, the explanation of these lines is omitted.

Also in this embodiment, two data signal lines DTLo, DTLe are arranged for every pixel column PRO. The data signal line DTLo corresponds to odd-numbered pixel rows PLI, and the pixel circuits Pa which belong to the odd-numbered pixel row PLI are connected to the data signal line DTLo. On the other hand, the data signal line DTLe corresponds to even-numbered pixel rows PLI, and the pixel circuits Pa which belong to the even-numbered pixel row PLI are connected to the data signal line DTLe. Each pixel circuit Pa of this embodiment includes thin film transistors T1a, T2a, T3a, a pixel capacitor C1a and an organic light emitting diode element OLED. The thin film transistors T1a, T2a are formed of an n-channel polycrystalline-silicon thin film transistor, while the thin film transistor T3a is formed of a p-channel polycrystalline-silicon thin film transistor.

In this embodiment, the data signal lines DTLo, DTLe are directly connected to the pixel capacitors C1a. One end of the pixel capacitor C1a is connected to a gate electrode of a thin film transistor T3 and a source electrode of a thin film transistor T2a. A source electrode of the thin film transistor T3 is connected to the power source line PWL, and a drain electrode of the thin film transistor T3 is connected to one end of an organic light emitting diode element OLED via the thin film transistor T1a. The other end of the organic light emitting diode element OLED is connected to a common ground terminal (cathode). A light emitting control line ILM is connected to a gate electrode of the thin film transistor T1a, and turning ON/OFF of the thin film transistor T1a is controlled by the light emitting control lines ILM. Further, the reset signal line RES is connected to a gate electrode of the thin film transistor T2a, and turning ON/OFF of the thin film transistor T2a is controlled by the reset signal line RES.

Figure 9:
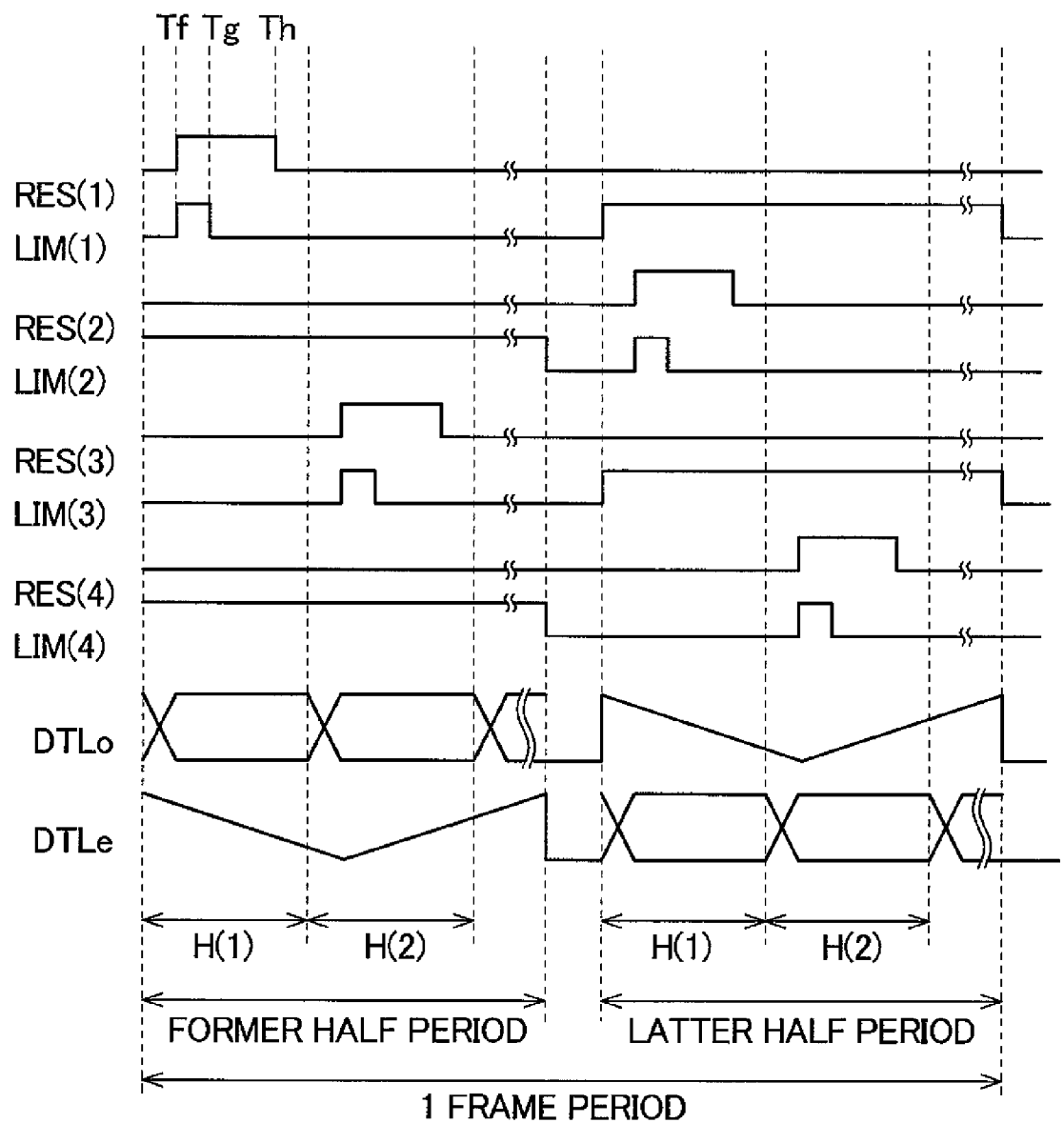
FIG. 9 is a schematic view showing one example of signals inputted into a light emission control line, a reset signal line and a data signal line.

The manner of operation of the pixel circuit Pa is explained. FIG. 9 is a schematic view showing signals inputted into the light emitting control lines ILM, the reset signal lines RES and the data signal lines DTLo, DTLe. In FIG. 9, symbol ILM(n) indicates the light emitting control line ILM corresponding to a pixel row PLI (n), and symbol RES (n) indicates the reset signal line RES corresponding to a pixel row PLI (n)

In this embodiment, 1 frame period (for example, ⅟60 second) is divided into a former half period, a latter half period and a pause period provided between the former half period and the latter half period. The pause period may not be provided.

Firstly, the former half period is explained. During the former half period, writing of a data signal voltage in pixels on the odd-numbered pixel row PLI and emission of light of the pixels on the even-numbered pixel row PLI are performed.

To be more specific, during the former half period, the respective odd-numbered pixel rows PLI are sequentially selected. For example, during the first horizontal period H(1) of the former half period, the pixel row PLI(1) is selected, and a data signal voltage is written in the pixels of the pixel row PLI(1). In this case, first of all, a signal which brings the thin film transistors T1a, T2a into an ON state is inputted into the reset signal line RES(1) and the light emitting control line ILM(1) corresponding to the pixel row PLI(1) (Tf). When the thin film transistors T1a, T2a assume an ON state, the gate electrode and the drain electrode of the thin film transistor T3 establish the diode connection of the same potential. Since a predetermined voltage is applied to the power source line PWL, the thin film transistor T3 and the organic light emitting diode element OLED become conductive with each other.

Thereafter, a signal which brings the thin film transistor T1a into an OFF state is inputted into the light emitting control line ILM(1) (Tg) so that the thin film transistor T3 and the organic light emitting diode element OLED become nonconductive from each other. In this case, the gate electrode and the drain electrode of the thin film transistor T3 are short-circuited via the thin film transistor T2a in an ON state and hence, a gate voltage of the thin film transistor T3 is set to a voltage lower than a voltage applied to the power source line PWL by a threshold voltage.

Thereafter, a signal which brings the thin film transistor T2a into an OFF state is inputted into the reset signal line RES(1) (Th) so that the thin film transistor T2a is brought into an OFF state. During the former half period, a data signal voltage corresponding to image data is inputted into the data signal line DTLo corresponding to the odd-numbered pixel rows PLI. Accordingly, in this case, a data signal voltage is inputted into one end of the pixel capacitor C1a from the data signal line DTLo. Further, a voltage at the other end of the pixel capacitor C1a is set equal to the gate voltage of the thin film transistor T3. Accordingly, the potential difference between both ends of the pixel capacitor C1a is held in the pixel capacitor C1a.

In the same manner as the first horizontal period H(1) of the former half period, during the second horizontal period H(2) of the former half period, the pixel row PLI (3) is selected, and a data signal voltage is written in the pixels on the pixel row PLI(3). In this manner, during the nth horizontal period H(n) of the former half period, the pixel row PLI(2n−1) is selected, and a data signal voltage is written in the pixels on the pixel row PLI (2n−1). In this manner, during the former half period, writing of the data signal voltages in the respective odd-numbered pixel rows PLI is executed.

Further, during the former half period, a signal which brings the thin film transistor T1a into an ON state is inputted into the light emitting control line ILM corresponding to the even-numbered pixel row PLI. For example, a signal which brings the thin film transistor T1a into an ON state is inputted into the light emitting control lines ILM(2), ILM(4), ILM(2n) and the like so that the thin film transistors T1a of the pixel circuits Pa on the pixel rows PLI(2), PLI(4), PLI(2n) and the like assume an ON state. Further, during the former half period, a triangular-wave voltage is inputted into the data signal line DTLe corresponding to the even-numbered pixel rows PLI from the triangular-wave voltage inputting line TWL. Then, correspondingly to the relationship between a voltage held in the pixel capacitor C1a and a triangular-wave voltage applied to the data signal line DTLe, the organic light emitting diode element OLED emits light. In this manner, during the former half period, the pixels on the even-numbered pixel rows PLI emit light.

As described above, during the former half period, the data signal voltage is written in the pixels on the odd-numbered pixel rows PLI and, at the same time, the pixels on the even-numbered pixel row PLI emit light.

Next, the latter half period is explained. Contrary to the former half period, during the latter half period, writing of a data signal voltage in the pixels on the even-numbered pixel rows PLI and the emission of light of the pixels on the odd-numbered pixel rows PLI are performed.

To be more specific, during the latter half period, the respective even-numbered pixel rows PLI are sequentially selected. For example, during the first horizontal period H(1) of the latter half period, the pixel row PLI(2) is selected, and a data signal voltage is written in the pixels on the pixel row PLI(2). In the same manner as the first horizontal period H(1) of the latter half period, during the second horizontal period H(2) of the latter half period, the pixel row PLI(4) is selected, and a data signal voltage is written in the pixels on the pixel row PLI(4). In this manner, during the nth horizontal period H(n) of the latter half period, the pixel row PLI(2n) is selected, and a data signal voltage is written in the pixels on the pixel row PLI(2n).

Further, during the latter half period, a signal which brings the thin film transistor T1a into an ON state is inputted into the light emitting control line ILM corresponding to the odd-numbered pixel row PLI. For example, a signal which brings the thin film transistor T1a into an ON state is inputted into the light emitting control lines ILM(1), ILM(3), ILM(2n−1) and the like so that the thin film transistors T1a of the pixel circuits Pa on the pixel rows PLI(1), PLI(3), PLI(2n−1) and the like assume an ON state. Further, during the latter half period, a triangular-wave voltage is inputted into the data signal line DTLo corresponding to the odd-numbered pixel rows PLI from the triangular-wave voltage inputting line TWL. Then, correspondingly to the relationship between a voltage held in the pixel capacitor C1a and a triangular-wave voltage applied to the data signal line DTLo, the organic light emitting diode element OLED emits light.

As described above, during the latter half period, the data signal voltage is written in the pixels on the even-numbered pixel row PLI and, at the same time, the pixels on the odd-numbered pixel row PLI emit light.

In the image display device according to this embodiment, each pixel column PRO is provided with two data signal lines consisting of the data signal line DTLo corresponding to the odd-numbered pixel rows PLI and the data signal line DTLe corresponding to the even-numbered pixel rows PLI. As a result, during the former half period of 1 frame period, it is possible to execute writing of the data signal voltage in the pixels of the odd-numbered pixel rows PLI and, at the same time, the emission of light from the pixels on the even-numbered pixel rows PLI. Further, during the latter half period, it is possible to execute writing of the data signal voltage in the pixels on the even-numbered pixel rows PLI and, at the same time, the emission of light from the pixels on the odd-numbered pixel rows PLI. According to the image display device of this embodiment, interlace driving can be realized.

In adopting a pixel control method which completely divides 1 frame period into a writing period and a light emitting period, the emission of light from the pixels is concentrated during the light emitting period and hence, a large quantity of current flows whereby large voltage drop may occur. When such a large voltage drop occurs, irregularities may be generated on a display screen. In this respect, according to the image display device of this embodiment, the emission of light from the pixels is distributed into the former half period and the latter half period and hence, it is possible to suppress the occurrence of the above-mentioned voltage drop. As a result, it is possible to alleviate lowering of display quality attributed to the voltage drop.

Further, in adopting the pixel control method which completely divides 1 frame period into the writing period and the light emitting period, data writing is performed within a time which is approximately half of 1 frame excluding the light emitting period. According to the image display device of this embodiment, data writing can be performed over the whole 1 frame and hence, time for writing data signal voltage can be almost doubled. That is, it is possible to suppress brightness irregularities attributed to shortage of data writing time.

Further, the image display device of this embodiment can, as explained hereinafter, reduce transmission delay of data signals. A transmission time t of a data signal is expressed by a product of capacitance C generated in the data signal line and resistance R of the data signal line (t=C*R). In this respect, according to the image display device of this embodiment, compared to a case where one data signal line is provided for each pixel column PRO, the number of pixel circuits Pa connected to one data signal line can be halved. As a result, the transmission delay of data signals can be reduced.

Further, in the image display device of this embodiment, the number of pixel circuits Pa connected to the data signal line DTLo and the number of pixel circuits Pa connected to the data signal line DTLe are set to be substantially equal. Due to such a constitution, the number of pixels which emit light during the former half period and the number of pixels which emit light during the latter half period become substantially equal. That is, in providing a uniform display over the whole screen, a quantity of electric current which flows during the former half period and a quantity of electric current which flows during the latter half period become substantially equal thus making brightness irregularities attributed to voltage drop substantially equal between the former half period and the latter half period. Further, a load applied to the data signal line DTLo and a load applied to the data signal line DTLe are set to be substantially equal. That is, the transmission delay of data signals is set to be substantially equal between the data signal line DTLo and the data signal line DTLe.

[Modification]

The invention is not limited to the embodiments explained heretofore.

For example, in the first and second embodiments, the pixel rows PLI are divided into two groups consisting of the group formed of the odd-numbered pixel rows PLI and the group formed of the even-numbered pixel rows PLI. However, the manner of dividing the pixel rows PLI into groups is not limited to such a method. For example, when N pieces of pixel rows are present, the pixel rows PLI may be divided into two groups consisting of a first group to which the first to the (N/2)th pixel rows PLI belong and a second group to which the (N/2+1)th to the Nth pixel rows PLI belong. In this case, the pixel circuits P, Pa on the pixel rows PLI belonging to the first group may be connected to the data signal line DTLo, and the pixel circuits P, Pa on the pixel rows PLI belonging to the second group may be connected to the data signal line DTLe.

Further, for example, according to the first and the second embodiments, three or more data signal lines may be provided to each pixel column PRO. In this case, the pixel rows PLI are divided into three or more groups. For example, assume a case where each pixel column PRO is provided with three data signal lines, and the pixel rows PLI is divided into three groups. In this case, in the first embodiment, a display control of one pixel row PLI is executed using three horizontal periods. In the second embodiment, 1 frame period is divided into first to third periods and a pause period. During the first period, writing of a data signal voltage in the first pixel row group is executed and, at the same time, emission of light from the second and the third pixel row groups is executed. During the second period, writing of data signal voltage in the second pixel row group is executed and, at the same time, the emission of light from the first and the third pixel row groups is executed. During the third period, writing of data signal voltage in the third pixel row group is executed and, at the same time, the emission of light from the first and the second pixel row groups is executed. Here, writing of data signal voltage and emission of light may be also controlled as follows. During the first period, writing of data signal voltage in the first pixel row group is executed and, at the same time, emission of light from the second pixel row group is executed. Further, during the second period, writing of data signal voltage in the second pixel row group is executed and, at the same time, emission of light from the third pixel row group is executed. Still further, during the third period, writing of data signal voltage in the third pixel row group is executed and, at the same time, emission of light from the first pixel row group is executed.

Further, the invention is also applicable to an image display device besides the organic EL display device. For example, the invention is applicable to an active-matrix type image display device. To be more specific, the invention is also applicable to an active-matrix-type liquid crystal display device.

Figure 10:
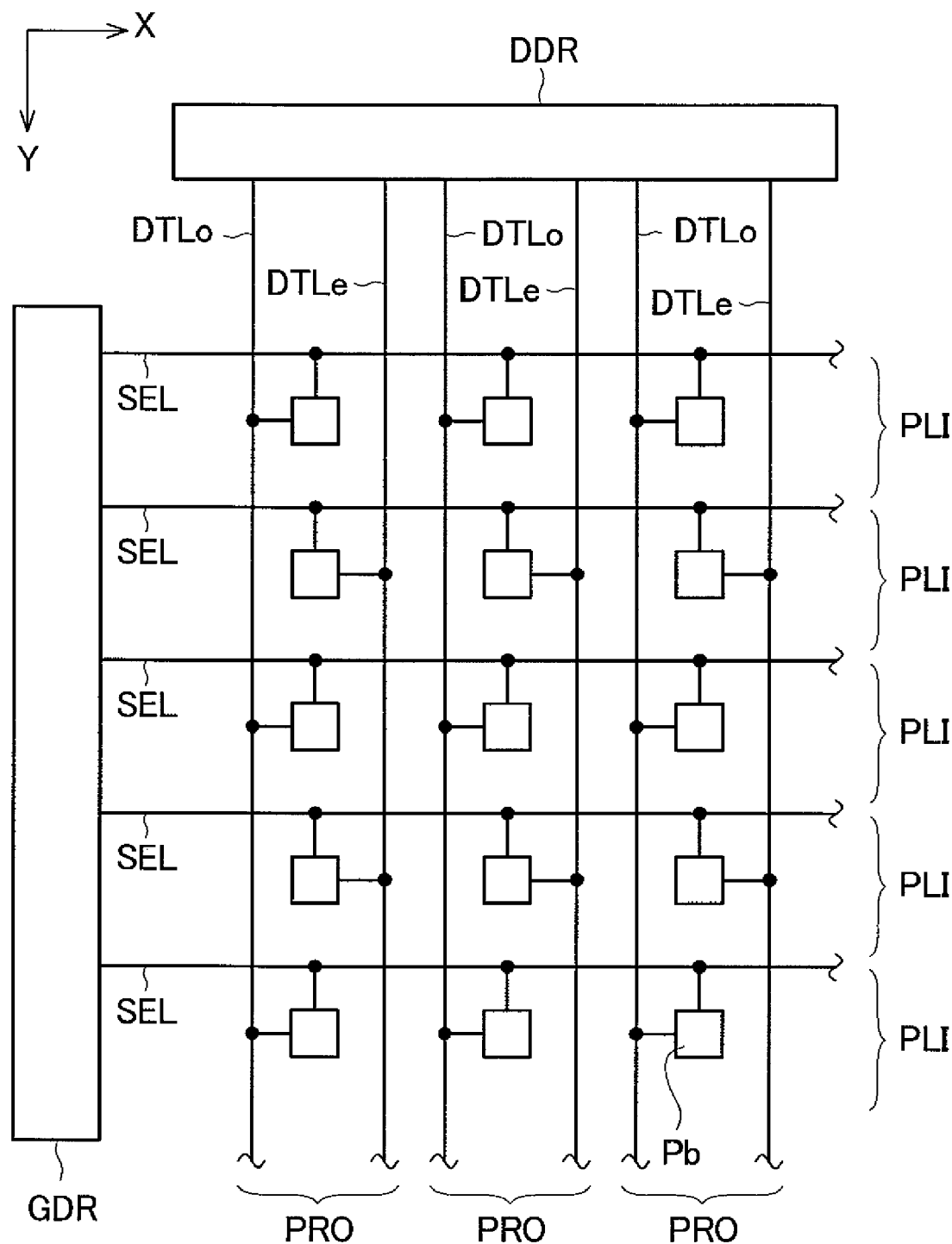
FIG. 10 is a view showing one example of the schematic constitution of circuits formed on a display panel of an image display device according to another embodiment of the invention.
Figure 11:
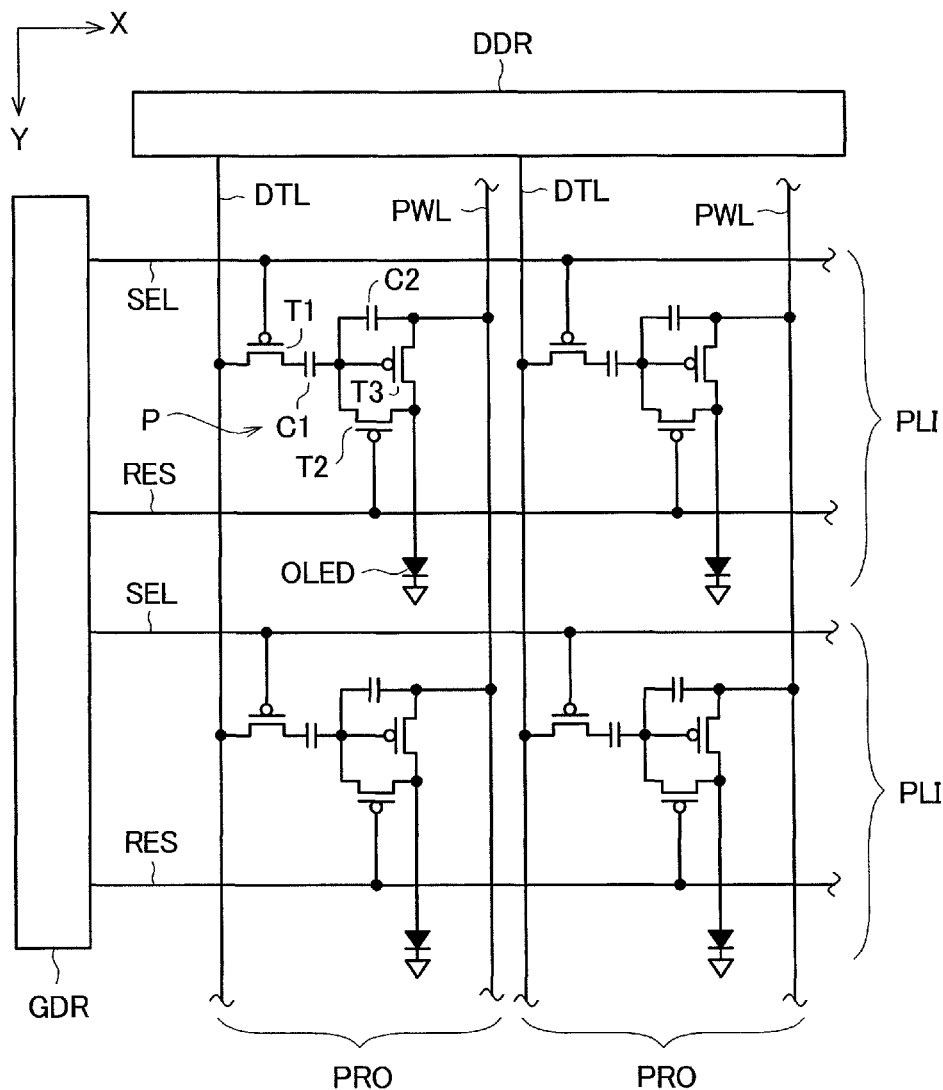
FIG. 11 is a view showing one example of the schematic constitution of circuits formed on a substrate of an organic EL display device of the related art.
Figure 12:
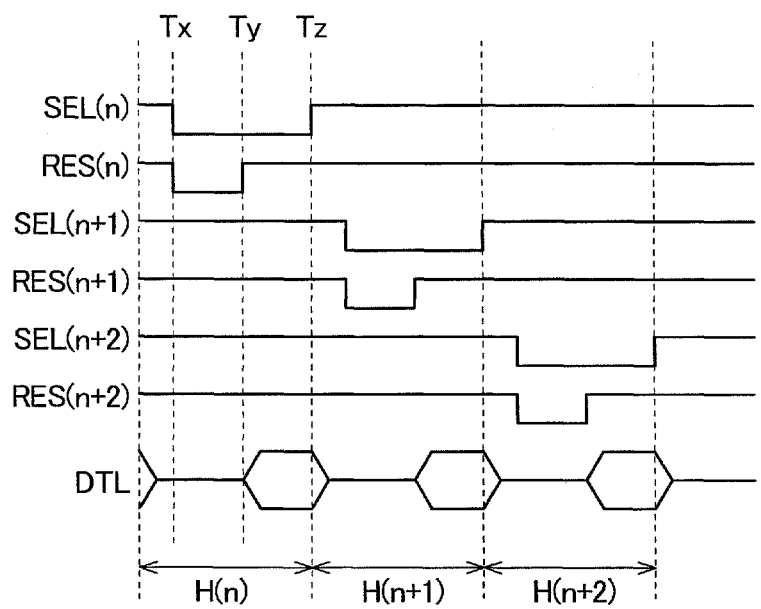
FIG. 12 is a schematic view showing one example of signals inputted into a scanning signal line, a reset signal line and a data signal line of the organic EL display device of the related art.
Figure 13A:
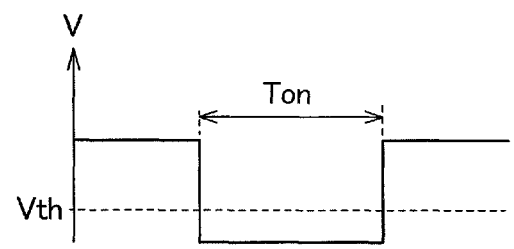
FIG. 13A is a view showing one example of a scanning signal or a reset signal in the pixel positioned relatively close to the gate drive circuit in the organic EL display device of the related art.
Figure 13B:
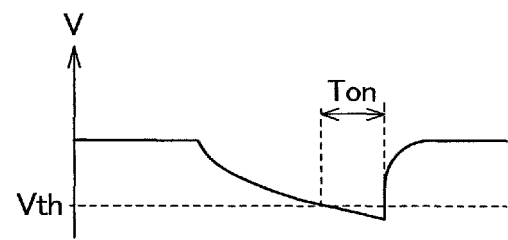
FIG. 13B is a view showing one example of a scanning signal or a reset signal in the pixel positioned relatively remote from the gate drive circuit in the organic EL display device of the related art.

FIG. 10 shows an example where the invention is applied to an active-matrix type liquid crystal display device. FIG. 10 shows one example of the schematic constitution of circuits of a display panel of the liquid crystal display device. In the example shown in FIG. 10, each pixel column PRO is provided with two data signal lines DTLo, DTLe. Pixel circuits Pb belonging to odd-numbered pixel rows PLI are connected to the data signal line DTLo, and pixel circuits Pb belonging to the even-numbered pixel rows PLI are connected to the data signal line DTLe. The invention is also applicable to an IPS (In Plane Switching) type liquid crystal display device, and is also applicable to a so-called VA (Virtual Alignment) or TN (Twisted Nematic) type liquid crystal display device.

What is claimed is:

1. An image display device, comprising:
   a substrate on which pixel circuits for performing a display control of pixels are arranged in a matrix array, wherein
   a plurality of data signal lines each of which is connected to at least one pixel circuit in one pixel circuit column are provided to the one pixel circuit column,
   the pixel circuits in the pixel circuit column are connected to any one of the plurality of data signal lines, the plurality of data signal lines are constituted of a first data signal line and a second data signal line, and the pixel circuits are connected to either one of the first data signal line and the second data signal line, thin film transistors are arranged in a region defined between the first data signal line and the second data signal line as viewed in a plan view of the substrate, a power source line is arranged on both sides of the pixel circuit column, and the pixel circuits of the pixel circuit column are connected to the power source line which is arranged on a side opposite to a side where the data signal line to which the pixel circuits are connected is arranged.

2. An image display device, comprising:

a substrate on which pixel circuits for performing a display control of pixels are arranged in a matrix array, wherein a plurality of data signal lines are provided for one pixel circuit column, and the plurality of data signal lines extend in the columnar direction of the pixel circuits arranged in a matrix array and are arranged parallel to each other in the row direction, the pixel circuits in the pixel circuit column are connected to any one of the plurality of data signal lines, the plurality of data signal lines include a first data signal line and a second data signal line along a first pixel circuit column, and the first data signal line and the second data signal line are arranged parallel to each other, the first pixel circuit column has the pixel circuits which are connected to the first data signal line and the pixel circuits which are connected to the second data signal line, a power source line is arranged on both sides of the pixel circuit column, and the pixel circuits of the pixel circuit column is connected to the power source line which is arranged on a side opposite to a side where the data signal line to which the pixel circuits are connected is arranged.

* * * * *